(12) United States Patent
Gottwald

(10) Patent No.: US 9,232,647 B2
(45) Date of Patent: Jan. 5, 2016

(54) PRINTED CIRCUIT BOARD WITH CAVITY

(75) Inventor: Thomas Gottwald, Dunningen-Seedorf (DE)

(73) Assignee: SCHWEIZER ELECTRONIC AG, Schramberg (DE)

( * ) Notice: Subject to any disclaimer, the term of this patent is extended or adjusted under 35 U.S.C. 154(b) by 205 days.

(21) Appl. No.: 13/641,860

(22) PCT Filed: Apr. 21, 2011

(86) PCT No.: PCT/EP2011/002036
§ 371 (c)(1),
(2), (4) Date: Dec. 19, 2012

(87) PCT Pub. No.: WO2011/131362
PCT Pub. Date: Oct. 27, 2011

(65) Prior Publication Data
US 2013/0199829 A1    Aug. 8, 2013

(30) Foreign Application Priority Data
Apr. 22, 2010   (DE) .................... 10 2010 018 499

(51) Int. Cl.
*H01L 23/02*  (2006.01)
*H05K 1/00*  (2006.01)
(Continued)

(52) U.S. Cl.
CPC .......... *H05K 1/0306* (2013.01); *G01L 19/0645* (2013.01); *H05K 1/02* (2013.01); *H05K 3/0067* (2013.01); *H05K 3/4697* (2013.01);
(Continued)

(58) Field of Classification Search
CPC ..... H05K 1/0306; H05K 3/46; H05K 3/4626; H05K 3/4667; H05K 3/4697; H05K 1/183; H05K 2203/1147; G01L 19/0645

USPC .................. 174/250, 258, 564; 361/761, 790, 361/792–795
See application file for complete search history.

(56) References Cited

U.S. PATENT DOCUMENTS 4,314,226 A * 2/1982 Oguro et al. ...................... 338/4
5,686,698 A * 11/1997 Mahadevan et al. .......... 174/522
(Continued)

FOREIGN PATENT DOCUMENTS

CN        101137894 A       3/2008
CN        201 434 281       3/2010
(Continued)

OTHER PUBLICATIONS

International Preliminary Report on Patentability, PCT/EP2011/002036, Oct. 23, 2012.
(Continued)

*Primary Examiner* — Sherman Ng
(74) *Attorney, Agent, or Firm* — Shlesinger Arkwright & Garvey LLP

(57) ABSTRACT

A printed circuit board multilayer construction comprising a layer stack composed of plurality of electrically insulating and/or conductive layers arranged one above another and a cavity in the interior of the layer stack, which extends laterally only in a partial region of the areal extent of the layer stack, is exposed to a pressure surrounding the printed circuit board multilayer construction through an opening provided in the layer stack and is sealed relative to ingress of liquid. Furthermore, the present invention relates to a method suitable for producing a printed circuit board multilayer construction of this type.

19 Claims, 2 Drawing Sheets

(51) Int. Cl.
*H05K 1/18* (2006.01)
*H05K 1/03* (2006.01)
*G01L 19/06* (2006.01)
*H05K 3/46* (2006.01)
*H05K 3/00* (2006.01)
*H05K 1/02* (2006.01)

(52) U.S. Cl.
CPC .............. *H05K1/0243* (2013.01); *H05K 1/183* (2013.01); *H05K 2201/10083* (2013.01); *H05K 2201/10151* (2013.01); *H05K 2203/063* (2013.01); *H05K 2203/1147* (2013.01); *Y10T 156/1062* (2015.01)

(56) References Cited

U.S. PATENT DOCUMENTS

| | | | |
|---|---|---|---|
| 6,078,229 A * | 6/2000 | Funada et al. | 333/193 |
| 6,090,468 A * | 7/2000 | Shimada et al. | 428/137 |
| 6,113,407 A | 9/2000 | Martin | |
| 6,316,732 B1 * | 11/2001 | Lim | 174/255 |
| 6,351,390 B1 | 2/2002 | Mayer et al. | |
| 6,449,168 B1 * | 9/2002 | Soderholm | 361/761 |
| 7,209,362 B2 | 4/2007 | Bando | |
| 7,319,598 B2 | 1/2008 | Steiner et al. | |
| 7,440,256 B2 * | 10/2008 | Hongo et al. | 361/306.1 |
| 2002/0067663 A1 * | 6/2002 | Loeppert et al. | 367/181 |
| 2002/0102004 A1 | 8/2002 | Minervini | 381/175 |
| 2004/0017670 A1 * | 1/2004 | Bando | 361/761 |
| 2005/0018864 A1 | 1/2005 | Minervini | |
| 2005/0207114 A1 | 9/2005 | Gall et al. | |
| 2006/0126313 A1 * | 6/2006 | Steiner et al. | 361/760 |
| 2008/0052906 A1 | 3/2008 | Lee et al. | |
| 2008/0070000 A1 | 3/2008 | Suzuki | |
| 2008/0102410 A1 | 5/2008 | Kim et al. | |
| 2008/0296056 A1 | 12/2008 | Kinoshita et al. | |
| 2009/0040704 A1 | 2/2009 | Seo et al. | |
| 2009/0071705 A1 | 3/2009 | Kim et al. | |
| 2009/0194831 A1 | 8/2009 | Casey et al. | |
| 2009/0242251 A1 | 10/2009 | Park et al. | |

FOREIGN PATENT DOCUMENTS

| | | |
|---|---|---|
| DE | 10 2007 006 462 A1 | 8/2008 |
| EP | 0 690 297 | 1/1996 |
| EP | 0946 861 | 10/1999 |
| EP | 1594353 | 9/2005 |
| EP | 1777919 | 4/2007 |
| EP | 1 346 601 | 5/2011 |
| JP | 2009 055490 | 3/2009 |
| JP | 2011-114251 | 9/2011 |
| WO | WO 2004 003991 A2 | 8/2004 |
| WO | WO 2005/091817 | 10/2005 |
| WO | WO 2009 036478 | 3/2009 |

OTHER PUBLICATIONS

European Patent Office, Application No. 11720030.3-1803, Office Action, Jul. 10, 2014.

Office Action, Chinese patent application No. 2011800311679, Nov. 4, 2014.

* cited by examiner

PRINTED CIRCUIT BOARD WITH CAVITY

TECHNICAL FIELD

The invention relates to a printed circuit board multilayer construction with a cavity and a method for producing a printed circuit board multilayer construction of this type.

PRIOR ART

A printed circuit board multilayer construction generally comprises a layer stack of several electrically insulating or dielectric film layers, for example, of a prepreg resin material, arranged one above the other with intermediate electrical conductor pattern levels. The layer stack is generally produced by laminating and/or pressing using dielectric prepreg layers, where at least part of the film layers arranged one above the other is provided on one or both sides with an electrically conductive layer that is structured into a desired electrical conductive pattern before placement one above the other to form the layer stack.

From patent application DE 10 2007 006 462 A1 an electronic circuit arrangement with a first and a second printed circuit board is known, where the first printed circuit board has a cutout and the second printed circuit board bears against the first printed circuit board such that at least one electronic component of the second circuit board is accommodated by the cutout of the first printed circuit board. Due to an arrangement of this type an overall lower installation height of the electronic circuit arrangement is achieved.

From WO 2009/036478 a printed circuit board element with at least one flexible printed circuit board portion and with at least one rigid printed circuit board portion with a component is known, where the component is accommodated in a cavity and a light-emitting part or light-receiving part projects beyond the edge of the cavity, where the flexible printed circuit board portion has a flexible layer of an optical photo-polymerizable material in which an optical waveguide is structured by means of irradiation in alignment with the light-emitting part or light-receiving part of the optoelectronic component.

US 2009/0242251 A1 likewise describes a printed circuit board arrangement, which comprises a layer in which a cavity is provided in which a chip is inserted. A filler material is provided for fixing the chip inside the cavity.

US 2009/0194831 A1 describes an integrated pressure sensor arrangement, which comprises a printed circuit board arrangement with a plurality of assemblies, the pressure sensor being mounted on a portion of the printed circuit board arrangement. The printed circuit board arrangement furthermore comprises at least one pressure transmission channel and an electrical transmission channel.

US 2009/0071705 describes a printed circuit board arrangement with integrated components, where the printed circuit board arrangement comprises a dielectric layer with a cavity embodied on one side. One component is inserted into the cavity so that one electrode of this component lies opposite a side of the dielectric layer. A second component is attached to one side of the first component in the form that an electrode of the second component points in the same direction as the electrode of the first component. A printed circuit board arrangement can thereby be produced in which a plurality of components with different thicknesses can be embedded.

From US 2009/0040704 A1 a printed circuit board is known which comprises a core layer, an insulation layer on the core layer, and a cavity formed on a portion of the insulation layer, where a circuit pattern is formed on the insulation layer and the circuit pattern has one or more external terminals above the cavity. The cavity is provided in order to give the external terminal for connection of an external apparatus a certain flexibility and elasticity.

From US 2008/0296056 A1 a printed circuit board arrangement is likewise known which has a cavity, where a plurality of bumps is provided inside the cavity, which serve as electrical connections and are isolated from one another by an insulating material.

US 2008/0052906 A1 and US 2008/0102410 A1 likewise disclose printed circuit board arrangements that have a cavity, where the cavity is used to accommodate components of the printed circuit board arrangement in order to thereby be able to form printed circuit board structures that are as thin as possible.

However, it is not known from the prior art, when providing a cavity of this type in a printed circuit board arrangement, to take into consideration in a targeted manner the pressure existing therein or to use the cavity to create pressure conditions that permit a specific use of the printed circuit board structure, such as providing, in a space-saving manner, a pressure sensor inside the cavity or creating an efficient and cost-effective high-frequency coupling structure.

SUMMARY OF THE INVENTION

Within the scope of the present invention the term printed circuit board multilayer construction means any type of two-layer or multilayer construction with at least one level of a conductive pattern structure. For example, loaded or empty printed circuit boards or printed circuit board parts, multilayer constructions and so-called interposers for use as component carriers in preassembled multilayer printed circuit board structures are covered thereby.

The present invention provides a printed circuit board multilayer construction with a layer stack of several electrically insulating and/or conductive layers arranged one above the other, and a cavity in the interior of the layer stack, where the cavity extends laterally only into a partial region of the areal extent of the layer stack, is exposed through an opening provided in the layer stack to the pressure surrounding the printed circuit board multilayer construction, and is sealed relative to ingress of liquid.

According to one possible embodiment, it is provided that a sensor, in particular a pressure sensor, is arranged in the cavity. The pressure sensor can measure an ambient pressure only when an equalization of pressure is created between the surroundings and the interior of the printed circuit board multilayer construction, which is possible only by providing an opening in the layer stack, which opening creates an equalization of pressure between an outer area surrounding the printed circuit board multilayer construction and the cavity formed. It should be noted that merely a hole created in the interior of the printed circuit board multilayer construction does not meet specific requirements for a pressure sensor provided therein, since the printed circuit board multilayer construction after a separation generally has to be washed or in part is also washed after loading, where liquid would penetrate into a cavity formed by a simple hole, which liquid then could no longer be removed. As a result it is provided according to the invention to seal the cavity formed relative to ingress of liquid.

According to one possible embodiment of the printed circuit board multilayer construction provided according to the invention, the cavity is produced by making a cutout or a hole through milling or stamping of an inner film or of a multilayer core, and by sandwiching with further inner films, prepreg layers or multilayer cores, the cutout is closed on one side or the hole is closed on both sides except the opening to be provided.

It is furthermore possible that when the cavity is formed, first a through hole or depth milling is produced. When providing a through hole, a covering on both sides is then necessary, whereas when a depth milling is provided, only a one-sided cover is needed in order to seal the cavity thus formed relative to ingress of liquid. Using an interposer, one side of a through hole can be closed by the interposer.

To seal relative to ingress of water it is further conceivable to cover the cavity at least on one side with the aid of at least one liquid-impermeable membrane.

The membrane can be inserted in the layer stack of the printed circuit board multilayer construction, for example, over the entire area of the areal extent of the layer stack so that the membrane covers the cavity quasi as an additional but continuous "layer."

However, alternatively thereto it is also possible to insert the membrane used for sealing only partially into the printed circuit board multilayer construction. That means that in so doing the at least one membrane is inserted in the layer stack of the printed circuit board multilayer construction only partially over the areal extent of the layer stack, the membrane extending at least so far over the areal extent of the layer stack that it realizes the sealing of the cavity relative to ingress of liquid.

The membrane can be effected, for example, by laminating between so-called no-flow prepreg layers or it can be glued tightly or firmly to an inner film, for example, to an outer cover layer.

The membrane used for sealing can be composed, for example, of microporous PTFE, in particular of Goretex, which allows gas diffusion, but rules out ingress of water. Alternatively, the membrane can also be composed of a PEEK or a polyimide or a mixture of the cited materials. The material used for the membrane is selected such that it can be glued tightly or laminated in and is resistant to media or processing temperatures used.

By varying the size and thickness of the membrane used, slower or quicker measurements of the existing pressure can be rendered possible with the provision of a pressure sensor inside the cavity. A thin membrane generally behaves elastically, and no diffusion is necessary with quick pressure changes. In contrast, with thick, inelastic membranes, equalization of pressure will occur only with a diffusion-related delay.

A printed circuit board multilayer construction provided according to the invention can be embodied in a further embodiment as an HF coupling structure. The printed circuit board multilayer construction with a cavity provided according to the invention is suitable for loading the printed circuit board with components or for application in high-frequency engineering. Since the cavity provided contains essentially air with a material-specific relative dielectric constant of close to 1, the cavity makes it possible, for example, to couple in or transfer high frequency from layer to layer in a low-loss manner. Generally, it is thereby possible to do without expensive high frequency material for an overall construction of a printed circuit board, and cost-effective mixed construction using standard FR-4 can be realized.

Furthermore, in a further embodiment of the printed circuit board multilayer construction provided according to the invention it can be provided to place a SAW filter into the cavity so that the cavity acts quasi as a housing for the SAW filter and thus the SAW filter has no physical contact with a resin material surrounding it, so that it can act optimally as a wave filter. SAW filters are based on the interference of signals of different propagation time, which is realized with the piezoelectric effect. A SAW filter (Surface Acoustic Wave) is also referred to as a surface wave filter and corresponds to a bandpass filter for electronic signals with a low bandwidth of a few MHz.

Furthermore, the present invention comprises a method for producing a printed circuit board multilayer construction according to the invention. The method comprises at least the following steps:

Providing an inner film or a multilayer core,
Producing a cutout in the inner film or the multilayer core,
Arranging the further layers of the layer stack below and/or above the inner film provided with the cutout or the multilayer core provided with the cutout, whereby a cavity is formed in the interior of the layer stack, which cavity extends laterally only in a partial region of the areal extent of the layer stack,
Laminating together and/or sandwiching of the multilayer arrangement thus obtained,
Individually providing at least one opening in one or more layers of the layers forming the layer stack so that the cavity formed is exposed to a pressure surrounding the printed circuit board multilayer construction, and
Sealing the cavity formed relative to ingress of liquid.

It is conceivable that the corresponding layer or the corresponding layers is or are already provided with a respective opening before the arrangement to form the layer stack. Furthermore, it is possible that respectively several openings, optionally lying close to one another, are provided.

In one possible embodiment of the method provided according to the invention, the cutout is produced by milling or stamping of the inner film or of the multilayer core and closed by sandwiching with further inner films, prepreg layers or multilayer cores forming the cavity on one side or on both sides except the opening to be provided.

The milling can be embodied as a through hole or as a depth milling. In the case of a through hole, a covering on both sides is necessary for sealing with respect to ingress of liquid, while with providing a depth milling only a one-sided covering is necessary.

Furthermore, it is conceivable to seal the cavity formed relative to ingress of liquid with the aid of at least one liquid-impermeable membrane, where the at least one membrane can be inserted in the layer stack over the whole area of the areal extent of the layer stack or only partially over the areal extent of the layer stack.

According to a further embodiment of the method provided according to the invention, the at least one membrane is laminated in between film layers, in particular between no-flow prepreg layers. Furthermore, it is likewise possible to glue the at least one membrane to an inner film in a tight or adhesively strong manner.

According to the invention it is likewise possible to arrange in the cavity a sensor, in particular a pressure sensor or a filter, in particular a SAW filter.

With the invention a pressure in the interior of the multilayer construction can be measured very easily by providing a pressure sensor in the cavity provided according to the invention in the interior of the printed circuit board multilayer construction, where the pressure sensor necessary for this can measure the existing pressure in a space-saving and furthermore reliable manner.

Furthermore, the printed circuit board multilayer construction provided with a cavity can be used efficiently in high-frequency engineering, since by providing the cavity, high frequency can be coupled in or transferred in a low-loss manner from layer to layer and furthermore in the overall structure of a corresponding printed circuit board it is possible to save on expensive HF material, and cost-effective mixed structures can be used.

Further advantages and embodiments of the invention are shown by the description of the attached drawing.

Naturally, the above-referenced features and the features to be explained below can be used not only in the respectively given combination, but also in other combinations or alone, without leaving the scope of the present invention.

The invention is shown diagrammatically in the drawing based on exemplary embodiments and is described in detail below with reference to the figures.

DETAILED DESCRIPTION OF THE DRAWING

Figure 1:
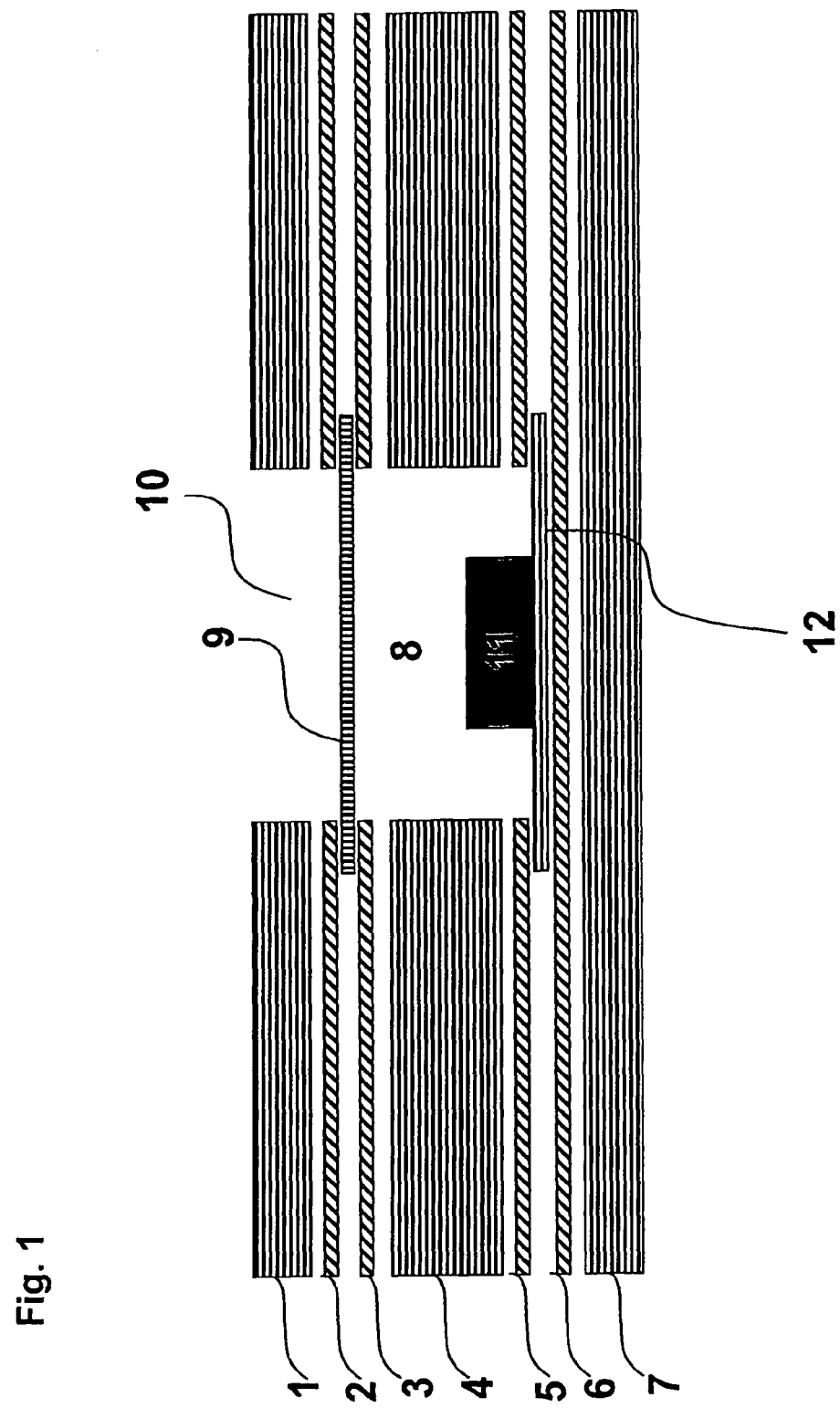
FIG. 1 shows a diagrammatic sectional view of a section of a possible embodiment of the printed circuit board multilayer construction according to the invention.

FIG. 1 shows a diagrammatic side view of a section of a possible embodiment of a printed circuit board multilayer construction according to the invention. A total of 7 film layers are shown here. The film layers 1, 4 and 7 can be respectively an inner film, where correspondingly respective further film layers, not shown here, can be applied onto the film layers 1 and 7. The film layer 4 is possibly also a multilayer core. The film layers 2, 3, 5 and 6 shown by oblique shading are, for example, so-called no-flow prepreg layers or prepreg layers. The film layers 1 through 5 are respectively provided with a cutout, so that by arranging these layers one on top of the other, as shown in FIG. 1, a cavity 8 is produced in the interior of the printed circuit board multilayer construction, which cavity is sealed relative to possible ingress of liquid by means of a membrane 9. If further film layers (not shown here) are applied onto the film layer 1, as described above, they likewise have respectively one cutout corresponding to the film layers 1 through 5. Via the opening 10, which is formed by the cutout respectively provided in the film layers 1 and 2, pressure equalization between the environment of the printed circuit board multilayer construction and the cavity 8 can be created. In the embodiment shown here the membrane 9 is inserted into the layer stack only partially over the areal extent of the layer stack. However, it is likewise possible that the membrane is arranged in the layer stack over the entire area of the areal extent of the layer stack. In the embodiment shown here, the membrane 9 is further laminated in between two no-flow prepreg layers, namely the film layers 2 and 3. It would also be possible to glue the membrane tightly to an inner film.

The provided membrane 9 can be composed, for example, of microporous PTFE, in particular of Goretex, which renders gas diffusion possible, but rules out the ingress of liquid. The membrane 9 can also be produced from a different material; however, it must be ensured that the material of the membrane 9 to be used can be firmly glued or laminated in and is resistant to media and processing temperatures used. Furthermore, ingress of liquid through the membrane must not be possible. Further possible materials are, for example, PEEK or polyimide.

Optionally, a mixture of the cited materials can also be used.

In the embodiment of the printed circuit board multilayer construction according to the invention shown here, a pressure sensor 11 is provided in the cavity 8, with the aid of which pressure sensor the pressure can be measured. By varying the size and the thickness of the membrane 9, slower or quicker measurements can be rendered possible. By providing a comparatively thin membrane, which behaves elastically, no diffusion is necessary with quick pressure changes. With thick, inelastic membranes, however, equalization of pressure will occur only with a diffusion-related delay.

In the embodiment shown here, the through hole produced by the respective cutouts in the film layers 1 through 5 is covered, in the direction of the layer 6 lying beneath in the layer stack, by an interposer 12.

Figure 2:
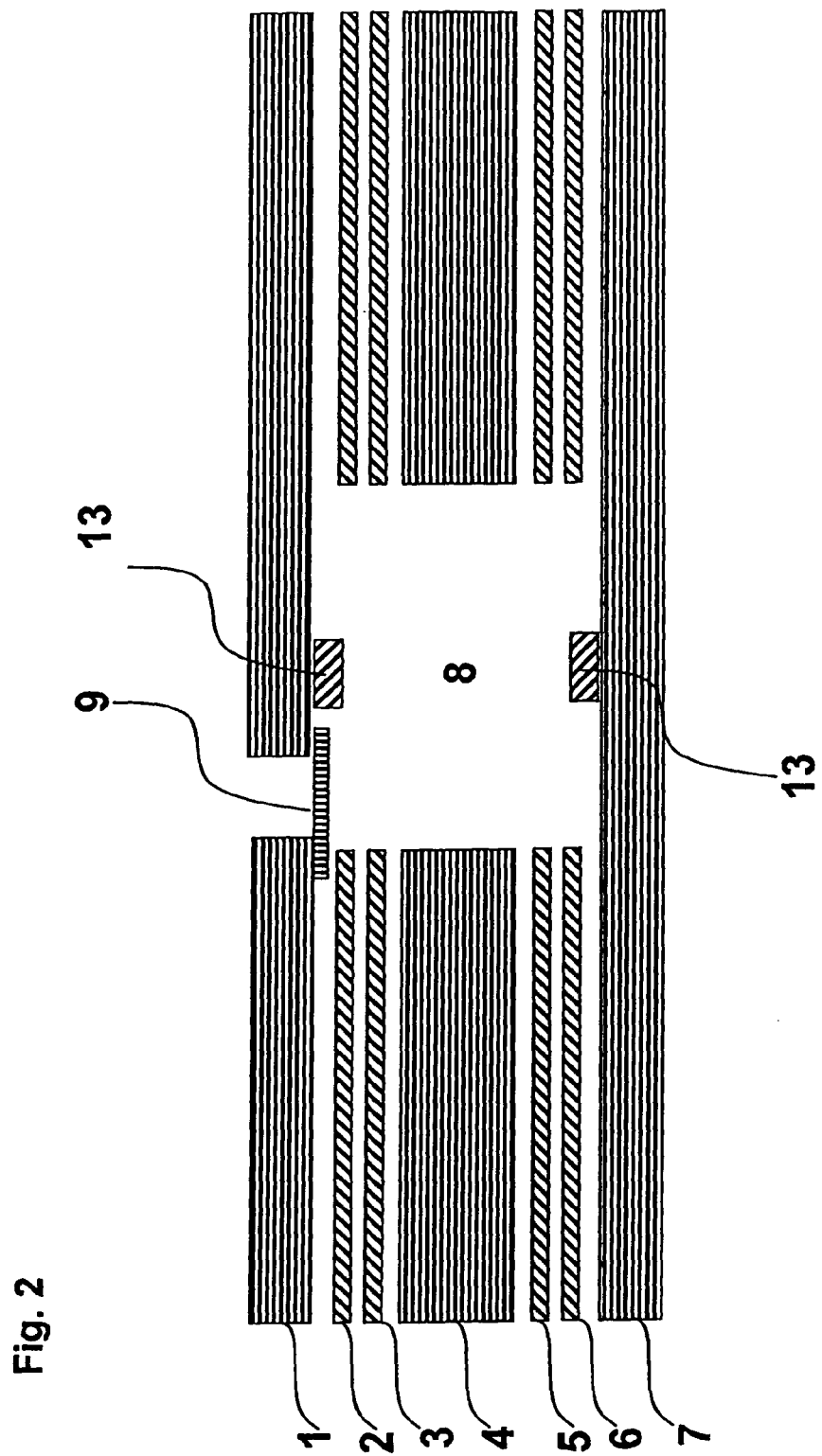
FIG. 2 shows a diagrammatic sectional view of a section of a further embodiment of the printed circuit board multilayer construction according to the invention.

FIG. 2 shows a diagrammatic side view of a further embodiment of the printed circuit board multilayer construction according to the invention. Here the printed circuit board multilayer construction is shown with a high frequency coupling structure 13. The film layers 1 and 7 are HF base material, while the film layers 2, 3 and 5, 6 are so-called no-flow prepreg layers. The film layer in which the actual cavity is provided can thereby be a standard FR 4 layer, which is comparatively inexpensive compared with the HF base material layers 1 and 7. The cavity 8 is formed here by a respective through opening in the film layers 2 through 6. The cavity 8 can optionally be sealed relative to the surroundings by a membrane 9, which here is arranged or glued below the film layer 1. It is also conceivable to laminate a membrane 9 of this type between two film layers, for example, between no-flow prepreg layers 2 and 3. In general, a membrane is not necessary for the coupling, but can be desirable or even required for reasons of processing. Since the material-specific relative dielectric constant inside the cavity 8, which is essentially filled with air, is 1, very good or low-loss coupling of high frequency signals from layer to layer or a low-loss transfer of the corresponding HF signals is produced. It is thus possible to save on expensive HF material in the overall construction of a corresponding printed circuit board multilayer construction, and cost-effective mixed constructions can be realized using standard FR 4. The coupling structure 13 provides, for example, that a transmission structure is arranged in the upper region of the cavity 8 below film layer 1 and a receiver structure is arranged in the lower region of the cavity 8, for example, directly on the film layer 7 closing the cavity 8.

The invention claimed is:

1. A printed circuit board multilayer construction, comprising:
   a layer stack of several electrically insulating and/or conductive layers arranged one above the other; and
   a cavity in an interior of the layer stack, wherein the cavity extends laterally only into a partial region of an areal extent of the layer stack, and through an opening provided in the layer stack, is exposed to a pressure surrounding the printed circuit board multilayer construction;
   wherein the cavity is sealed relative to ingress of liquid with an aid of at least one liquid-impermeable membrane that is laminated in between layers of the layer stack;
   wherein the at least one liquid-impermeable membrane is inserted in the layer stack and extends only partially over the areal extent of the insulating layers.

2. The printed circuit board multilayer construction according to claim 1, wherein the cavity is produced by milling or stamping of an inner film or of a multilayer core and by sandwiching with further inner films, prepreg layers or multilayer cores, and is closed on one side or on both sides except the opening.

3. The printed circuit board multilayer construction according to claim 2, wherein the cavity is embodied as a through hole or as a depth milling.

4. The printed circuit board multilayer construction according to claim 1, wherein the at least one liquid-impermeable membrane is inserted in the layer stack over the entire area of the areal extent of the layer stack.

5. The printed circuit board multilayer construction according to claim 1, wherein the at least one liquid-impermeable membrane is produced from a material comprising microporous PTFE, including Goretex, PEEK, polyimide or a mixture thereof.

6. The printed circuit board multilayer construction according to claim 1, wherein the at least one liquid-impermeable membrane is laminated in between film layers, including between no-flow prepreg layers, or is tightly/firmly glued to an inner film.

7. The printed circuit board multilayer construction according to claim 1, wherein a sensor, including a pressure sensor, is arranged in the cavity.

8. The printed circuit board multilayer construction according to claim 1, wherein a SAW filter is arranged in the cavity.

9. The printed circuit board multilayer construction according to claim 1, wherein the printed circuit board multilayer construction is embodied as a HF coupling structure.

10. A method for producing a printed circuit board multilayer construction comprising a layer stack of several electrically insulating and/or conductive layers arranged one above the other, and a cavity in an interior of the layer stack, wherein the cavity extends laterally only into a partial region of an areal extent of the layer stack, and through an opening provided in the layer stack, is exposed to a pressure surrounding the printed circuit board multilayer construction, and wherein the cavity is sealed relative to ingress of liquid, the method comprising the following steps of:
    providing an inner film or a multilayer core;
    producing a cutout in the inner film or the multilayer core;
    arranging further layers of the layer stack that are not part of the inner film or the multilayer core below and/or above the inner film provided with the cutout or the multilayer core provided with the cutout, whereby a cavity is formed in the interior of the layer stack, wherein the cavity extends laterally only in a partial region of the areal extent of the layer stack;
    laminating together the multilayer arrangement thus obtained;
    individually providing at least one opening in one or more of the layers forming the layer stack so that the cavity formed is exposed to a pressure surrounding the printed circuit board multilayer construction; and
    sealing the cavity formed relative to ingress of liquid with an aid of at least one liquid-impermeable membrane that is laminated in between layers of the layer stack;
    wherein the at least one liquid-impermeable membrane is inserted in the layer stack and extends only partially over the areal extent of the insulating layers.

11. The method according to claim 10, wherein the cutout is produced by milling or stamping of the inner film or of the multilayer core and, by sandwiching with further inner films, prepreg layers or multilayer cores, and forming the cavity, is closed on one side or on both sides except the opening.

12. The method according to claim 10, wherein the cutout is carried out as a through hole or as a depth milling.

13. The method according to claim 10, wherein the at least one liquid-impermeable membrane is inserted in the layer stack over the areal extent of the layer stack or only partially over the areal extent of the layer stack.

14. The method according to claim 10, wherein the at least one liquid-impermeable membrane is laminated in between layer films, including between no-flow prepreg layers, or is tightly/firmly glued to an inner film.

15. The method according to claim 10, wherein a sensor, including a pressure sensor, or a filter, including a SAW filter, is arranged in the cavity.

16. A printed circuit board multilayer construction, comprising:
    a layer stack of several electrically insulating and/or conductive layers arranged one above the other including no-flow prepreg layers; and
    a cavity in an interior of the layer stack, wherein the cavity extends laterally only into a partial region of an areal extent of the layer stack, and through an opening provided in the layer stack, is exposed to a pressure surrounding the printed circuit board multilayer construction;
    wherein the cavity is sealed relative to ingress of liquid with an aid of at least one liquid-impermeable membrane that is laminated in between layers of the layer stack;
    wherein the at least one liquid-impermeable membrane is inserted in the layer stack and extends only partially over the areal extent of the insulating layers; and
    wherein the layer stack is formed by laminating together the electrically insulating and/or conductive layers using the prepreg layers.

17. A method for producing a printed circuit board multilayer construction comprising a layer stack of several electrically insulating and/or conductive layers arranged one above the other, and a cavity in an interior of the layer stack, wherein the cavity extends laterally only into a partial region of an areal extent of the layer stack, and through an opening provided in the layer stack, is exposed to a pressure surrounding the printed circuit board multilayer construction, and wherein the cavity is sealed relative to ingress of liquid, the method comprising the following steps of:
    providing an inner film or a multilayer core;
    producing a cutout in the inner film or the multilayer core;
    arranging further layers of the layer stack including no-flow prepreg layers that are not part of the inner film or the multilayer core below and/or above the inner film provided with the cutout or the multilayer core provided with the cutout, whereby a cavity is formed in the interior of the layer stack, wherein the cavity extends laterally only in a partial region of the areal extent of the layer stack;
    laminating together the multilayer arrangement thus obtained using the prepreg layers;
    individually providing at least one opening in one or more of the layers forming the layer stack so that the cavity formed is exposed to a pressure surrounding the printed circuit board multilayer construction; and
    sealing the cavity formed relative to ingress of liquid with an aid of at least one liquid-impermeable membrane that is laminated in between layers of the layer stack;
    wherein the at least one liquid-impermeable membrane is inserted in the layer stack and extends only partially over the areal extent of the insulating layers.

18. A printed circuit board multilayer construction, comprising:
- a layer stack of several electrically insulating and/or conductive layers arranged one above the other;
- a cavity in an interior of the layer stack, wherein the cavity extends laterally only into a partial region of an areal extent of the layer stack, and through an opening provided in the layer stack, is exposed to a pressure surrounding the printed circuit board multilayer construction;
- wherein the cavity is sealed relative to ingress of liquid with an aid of at least one liquid-impermeable membrane that is laminated in between layers of the layer stack;
- wherein the at least one liquid-impermeable membrane is inserted in the layer stack and extends only partially over the areal extent of the insulating layers; and
- wherein one of the further layers is an interposer for use as component carrier which the interposer covers the cutout in one direction.

19. A method for producing a printed circuit board multilayer construction comprising a layer stack of several electrically insulating and/or conductive layers arranged one above the other, and a cavity in an interior of the layer stack, wherein the cavity extends laterally only into a partial region of an areal extent of the layer stack, and through an opening provided in the layer stack, is exposed to a pressure surrounding the printed circuit board multilayer construction, and wherein the cavity is sealed relative to ingress of liquid, the method comprising the following steps of:
- providing an inner film or a multilayer core;
- producing a cutout in the inner film or the multilayer core;
- arranging further layers of the layer stack that are not part of the inner film or the multilayer core below and/or above the inner film provided with the cutout or the multilayer core provided with the cutout, whereby a cavity is formed in the interior of the layer stack, wherein the cavity extends laterally only in a partial region of the areal extent of the layer stack;
- laminating together the multilayer arrangement thus obtained;
- individually providing at least one opening in one or more of the layers forming the layer stack so that the cavity formed is exposed to a pressure surrounding the printed circuit board multilayer construction; and
- sealing the cavity formed relative to ingress of liquid with an aid of at least one liquid-impermeable membrane that is laminated in between layers of the layer stack;
- wherein the at least one liquid-impermeable membrane is inserted in the layer stack and extends only partially over the areal extent of the insulating layers;
- wherein one of the further layers is an interposer for use as component carrier which the interposer covers the cutout in one direction.

* * * * *